(12) United States Patent
Lu et al.

(10) Patent No.: US 6,924,447 B2
(45) Date of Patent: Aug. 2, 2005

(54) WATERPROOF STRUCTURE OF PRINTED CIRCUIT BOARD

(75) Inventors: Tien-Min Lu, Hsien-Tien (TW); Ching-Hsiang Chen, Hsin-Tien (TW)

(73) Assignee: Shin Jiuh Corp., Taipei Hsien (TW)

(*) Notice: Subject to any disclaimer, the term of this patent is extended or adjusted under 35 U.S.C. 154(b) by 177 days.

(21) Appl. No.: 10/370,614

(22) Filed: Feb. 24, 2003

(65) Prior Publication Data

US 2004/0163845 A1 Aug. 26, 2004

(51) Int. Cl.$^7$ .......................................... H01H 31/702
(52) U.S. Cl. ...................................................... 200/515
(58) Field of Search ................................ 200/515, 306, 200/302.1, 302.2

(56) References Cited

U.S. PATENT DOCUMENTS

| | | | | |
|---|---|---|---|---|
| 4,415,780 A | * | 11/1983 | Daugherty et al. | 200/515 |
| 6,144,003 A | * | 11/2000 | Kamishima | 200/515 |
| 6,441,330 B2 | * | 8/2002 | Liao | 200/515 |
| 6,610,943 B1 | * | 8/2003 | Durfee et al. | 200/515 |

FOREIGN PATENT DOCUMENTS

| | | |
|---|---|---|
| TW | 236428 | 12/1994 |
| TW | 342983 | 10/1998 |
| TW | 358571 | 5/1999 |
| TW | 369191 | 9/1999 |
| TW | 385891 | 3/2000 |
| TW | 464012 | 11/2001 |
| TW | 470190 | 12/2001 |
| TW | 476429 | 2/2002 |
| TW | 477446 | 2/2002 |
| TW | 504026 | 9/2002 |

\* cited by examiner

*Primary Examiner*—Renee Luebke
(74) *Attorney, Agent, or Firm*—Birch, Stewart, Kolasch & Birch, LLP

(57) ABSTRACT

A waterproof structure is used with a printed circuit board, which is primarily composed of an upper layer membrane, a lower layer membrane, and an insulation layer, which are conjoined to one another. Besides, at least one first channel and second channel are provided on the upper layer membrane and the lower layer membrane respectively and correspondingly. Also, a pressure-adjusting hole, whose periphery is larger than that of the first channel and the second channel, is provided on the insulation layer corresponding to the positions of the first channel and the second channel. After the first channel, the second channel, and the pressure-adjusting hole of the insulation layer have been conjoined, a waterproof unit will be formed at a place where the contact points of the three are not connected to one another. The waterproof unit contains circulated air and prevents moisture from permeating into the circuit board thereby avoiding a short circuit of the circuit board.

3 Claims, 5 Drawing Sheets

WATERPROOF STRUCTURE OF PRINTED CIRCUIT BOARD

FIELD OF THE INVENTION

The invention relates to a waterproof structure of a printed circuit board and, more particularly, to a structure of printed circuit board having a build-in waterproof unit capable of preventing moisture from entering the interior of the circuit board so that the circuit board can avoid short circuit problems.

BACKGROUND OF THE INVENTION

A pushbutton structure has been a primary component on home appliances, testing meters and computer peripherals, and all of these products can be easily controlled through designs of pushbuttons.

A membrane printed circuit board inside the pushbutton structure utilized by a common computer or notebook computer primarily comprises an upper layer membrane, a lower layer membrane and an insulation layer arranged by stacking. Besides, there is no glue applied on any of the three layers so that when a rubber body is pressed down to squeeze air, the contact point of the upper layer membrane and that of the lower layer membrane will touch each other. In an event that a water drop has dripped into the inside of a keyboard by a user, there will not be a short-circuit problem generated on the membrane printed circuit board at first. However, as soon as the rubber body begins to restore from a pressed-down manner, it will absorb the water drop from inside the keyboard to the membrane printed circuit board due to the vacuum force generated by the rubber body, which will result in short-circuit problem on the membrane printed circuit board.

On the other hand, there is another kind of printed circuit board primarily comprising an upper layer membrane and lower layer membrane made of soft plastic. A plurality of conductive portions are printed on the upper layer membrane, whereas a plurality of contact portions corresponding to the conductive portions are printed on the lower layer membrane; also, an insulation portion is printed on each of the contact portions, and then the insulation portion, the upper layer membrane and the lower layer membrane are glued together to form a membrane printed circuit board.

Moreover, some people in the industry have developed several kinds of waterproof keyboard structures with different designs to improve the waterproof structure of a keyboard, which are listed below:

1. A membrane that is provided on the lower side of a circuit unit in a waterproof keyboard is disclosed at Taiwan Patent Gazette Publication No. 470190 entitled "Waterproof Keyboard", wherein the membrane is closely connected to a resilient rubber body of the keyboard so that the circuit unit can be sealed between the resilient rubber body and the membrane.

2. A structure of waterproof keyboard is disclosed at Taiwan Patent Gazette Publication No. 476429 entitled "Waterproof Keyboard". The waterproof keyboard includes: a top lid and a base, wherein a plurality of pushbuttons are provided encased on the surface of the top lid; a positioning structure protruding downwards and extending from the bottom face of the top lid to the base to be connected to the base so that the top lid can be fastened to the base; a conducting sheet located on the upper side of the base; and a resilient body located on the upper side of the conducting sheet, wherein a positioning hole on the resilient body is provided so that the positioning structure can pass through the positioning hole, and the perimeter of the positioning structure is designed to be closely fitted into the positioning hole on the resilient body so that the moisture permeating in from the top lid can be blocked on the resilient body.

3. A structure of waterproof keyboard is disclosed at Taiwan Patent Gazette Publication No. 504026 entitled "Waterproof Keyboard", wherein a groove is provided on the top lid of the keyboard, and a plurality of drainage holes are provided at the front edge of the groove for passing through therein to the bottom of the top lid and are downwardly connected to a plurality of drainage columns. Also, a plurality of fitting-in columns corresponding to the drainage columns are provided on the base of the keyboard, and a through-hole is formed inside of each fitting-in column so that a drainage can insert into its corresponding through-hole of the fitting-in column.

Aside from the above-mentioned, there are more waterproof keyboard structures that are similar to the foregoing keyboard structures, including Taiwan Patent Gazette Publication No. 477446 entitled "Waterproof Keyboard", Taiwan Patent Gazette Publication No. 464012 entitled "Structure of Waterproof Keyboard for Notebook Computer", Taiwan Patent Gazette Publication No. 385891 entitled "Waterproof Keyboard", Taiwan Patent Gazette Publication No. 369191 entitled "Waterproof Keyboard", Taiwan Patent Gazette Publication No. 358571 entitled "Waterproof Keyboard", Taiwan Patent Gazette Publication No. 342983 entitled "Structure of Waterproof Keyboard", and Taiwan Patent Gazette Publication No. 236428 entitled "Improved Structure of Waterproof Keyboard".

Despite that the waterproof effect can be achieved by the foregoing improved designs for the membrane printed circuit board or by combining an improved keyboard structure to a conventional membrane printed circuit board, the process flow for redesigning a printed circuit board is still very complicated. Therefore, it is time consuming and labor consuming to do the redesigning. Moreover, it is difficult to make a precise positioning for the relative components; therefore, the production cost will also become higher.

SUMMARY OF THE INVENTION

In viewing the above problems, the object of the invention is to employ a waterproof unit that can be printed on the circuit board directly and can be preserved with a ventilation hole only so that after the whole printed circuit board has been fully conjoined, the waterproof unit can effectively prevent the moisture from entering the interior of the circuit board and causing short circuit problems. Since the waterproof unit can be printed directly on the circuit board without any additional processing due to its simple structure, time and labor savings can be achieved as well as lowering of the production cost.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENT

Figure 1:
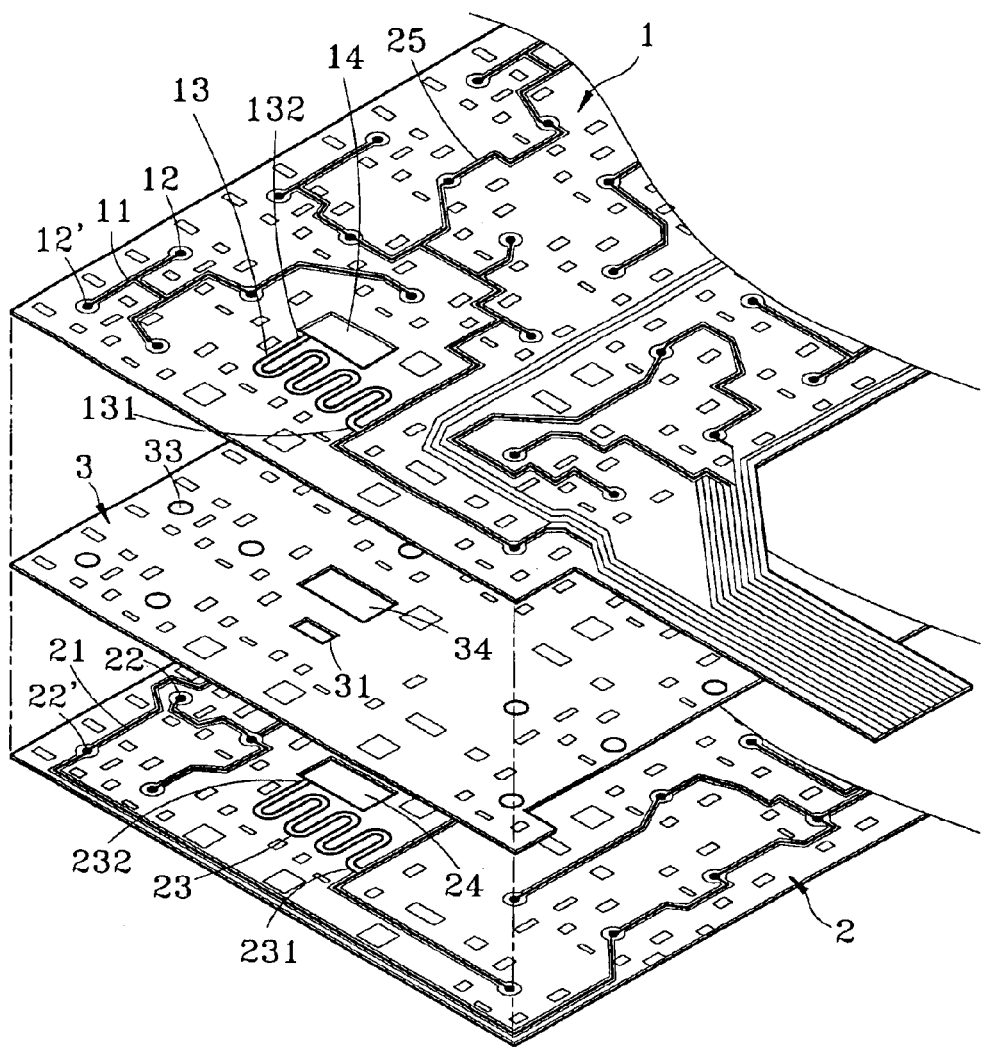
FIG. 1 is a schematic diagram showing perspective exploded view of the invention.
Figure 2:
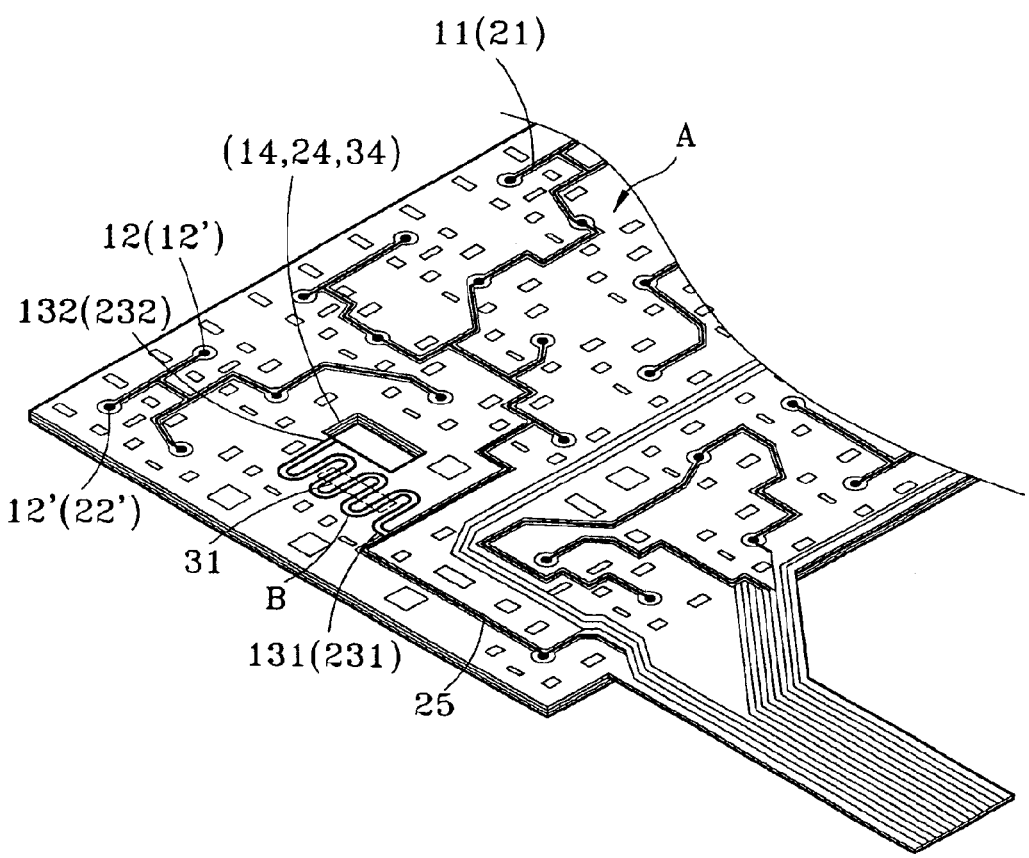
FIG. 2 is schematic diagram showing perspective contour of the invention.
Figure 4:
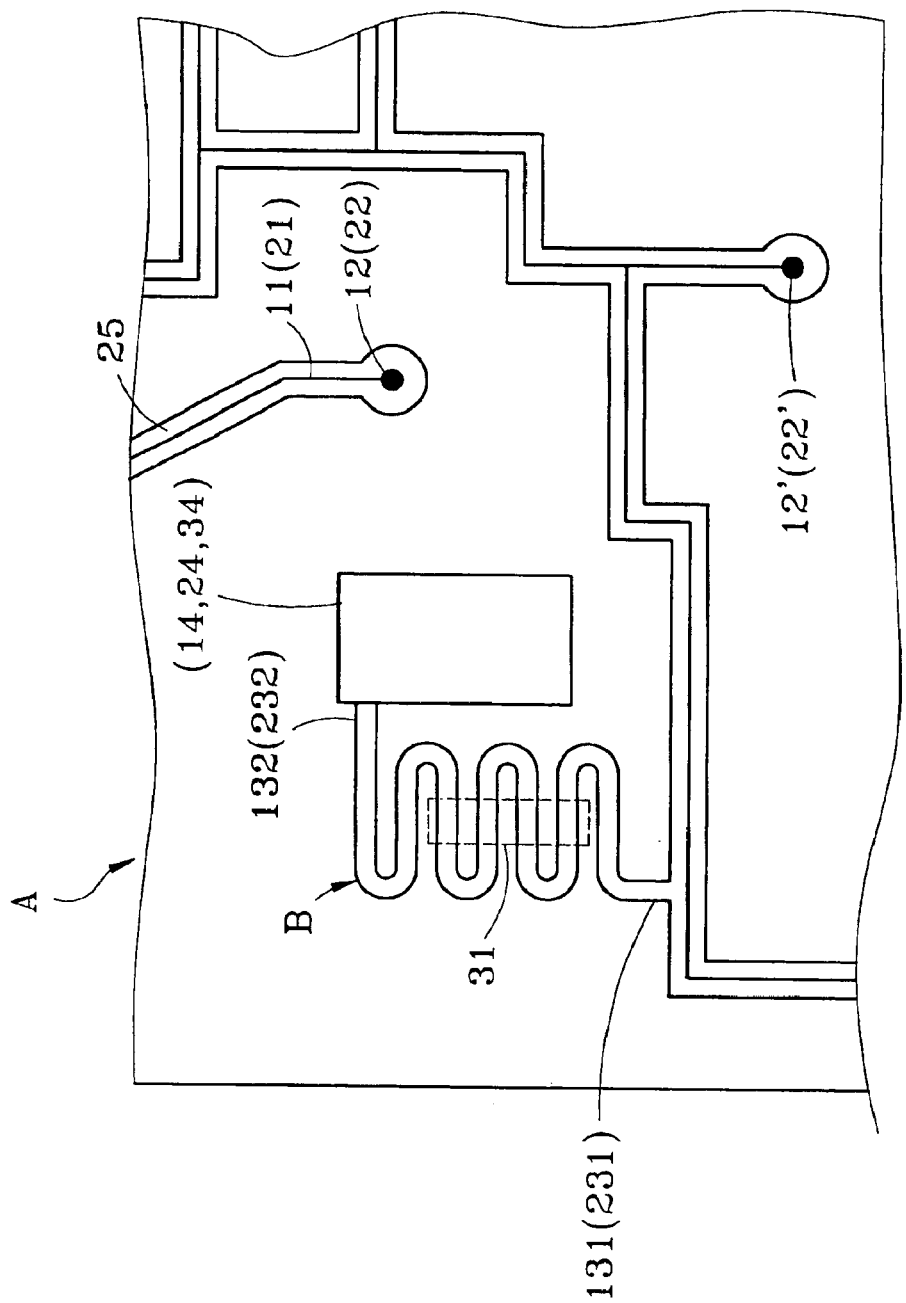
FIG. 4 is a partially enlarged schematic diagram of the invention.
Figure 5:
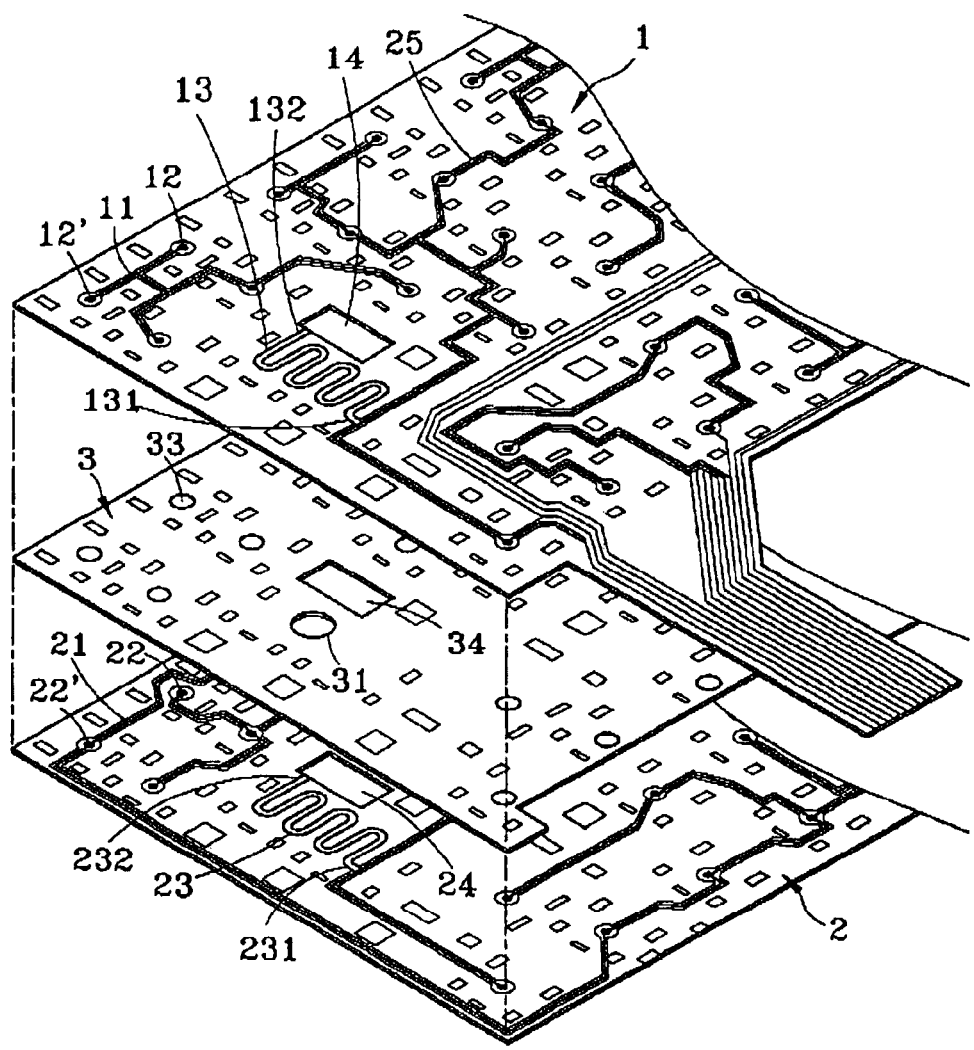
FIG. 5 is schematic diagram similar to FIG. 1 but showing a circular pressure-adjusting hole.

Referring to FIGS. 1, 2, and 4, they are all schematic diagrams, including a perspective exploded view, a perspective contour, and a partially enlarged view of the invention respectively. As shown in the figures, a waterproof structure of a printed circuit board of the invention is primarily composed of an upper layer membrane 1, a lower layer membrane 2, and an insulation layer 3, which are conjoined to one another. Besides, conducting lines 11 & 21 for transmitting signals are printed on the upper and the lower layer membranes 1 & 2. The conducting lines 11 & 21 also include line channels 25 and contact points 12 & 22. A plurality of go-through holes 33 are provided on the insulation layer 3 corresponding to the positions of the contact points 12 & 22 of the conducting lines 11 & 21. In addition, ventilation holes 14, 24 & 34 located correspondingly to one another are provided on the upper layer membrane 1, the lower layer membrane 2, and the insulation layer 3 respectively, wherein a waterproof unit B is provided between the ventilation holes 14, 24 & 34 and the conducting lines 11 & 21. Also, a first channel and a second channel 13 & 23 of the waterproof unit B are provided in the upper layer membrane 1 and the lower layer membrane 2 respectively and correspondingly. In addition, one of the first openings 131 and the other first opening 231 are provided on one end of the first channel 13 and on one end of the second channel 23 respectively, whereas one of the second openings 132 and the other second opening 232 are provided on the other end of the first channel 13 and on the other end of the second channel 23 respectively. The first openings 131 & 231 are connected to the line channels 25 on the conducting lines 11 & 21, whereas the second openings 132 & 232 are connected to the ventilation holes 14, 24 & 34. Also, a pressure-adjusting hole 31, whose periphery is larger than that of the first channel 13 and that of the second channel 23, is provided on the insulation layer 3 corresponding to the positions of the first and the second channels 13 & 23. The waterproof unit B is formed by connecting the first channel 13, the second channel 23, and the pressure-adjusting hole 31 of the insulation layer 3 so that the air generated by the contact points 12 & 22 of the upper and the lower layer membranes 1 & 2 due to receiving press-down force can be discharged to the outside. On the other hand, the waterproof unit B can prevent the external moisture from permeating into the conducting lines 11 & 21 so as to prevent the printed circuit board A from short Similar to FIG. 1, FIG. 5 shows a schematic diagram of the invention wherein the pressure-adjusting hole 31 is circular instead of rectangular.

Referring to FIGS. 2, 3A, 3B and 4, they are all schematic diagrams, including a perspective contour, statuses of in-use and a partially enlarged view of the invention respectively. As shown in the FIGS., when a pushbutton (not shown) is pressed down, the air located inside the contact points 12 & 22 will pass through the line channels 25 and the waterproof unit B, heading for the ventilation holes 14, 24 & 34 to leave the printed circuit board A.

After the pushbutton (not shown) has restored to its original manner, the line channel 25 will generate vacuum force owing to the Siphon Phenomenon; therefore, the moisture from the external world may be absorbed into the printed circuit board A. As soon as the moisture enters the waterproof unit B, the first channel 13 and the second channel 23 that have a shape of multiple consecutive U can effectively increase the difficulty for the moisture to get in. In addition, because the diameter of the pressure-adjusting hole 31 is larger than that of the first and that of the second channels 13 & 23, the moisture entering from the outside world will be collected in the pressure-adjusting hole 31 by means of a change in pressure made between the pressure-adjusting hole 31 and the first and the second channels 13 & 23. Therefore, the moisture will be prevented from getting into the internal of the printed circuit board A to result in short circuit on the printed circuit board.

Figure 3B:
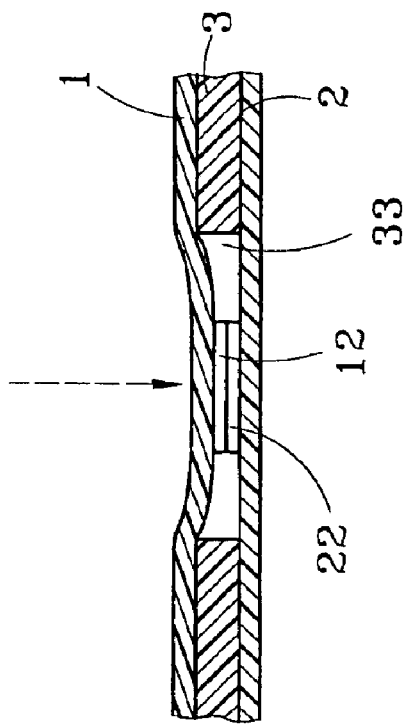
FIG. 3A and FIG. 3B are schematic diagrams showing statuses of the invention when it is in use.
Figure 3A:
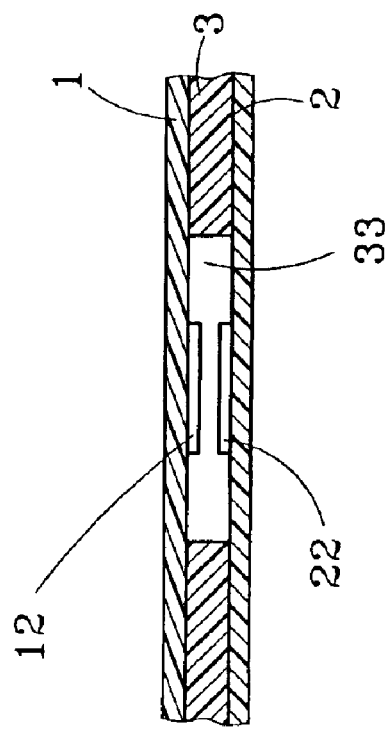

Further, when the pushbutton (not shown) is pressed again, as shown in FIG. 3B, the air located inside the contact points 12, 22, 12' & 22' will again be squeezed into the waterproof unit B through the line channels 25; consequently, the moisture blocked inside the pressure-adjusting hole 31 will then be squeezed out of the ventilation holes 14, 24 & 34. Through the operation of such squeezing and pushbutton-releasing cycles, the moisture can be prevented from entering into the conducting lines 11 & 21 of the printed circuit board A so that short circuit will not occur on the conducting lines 11 & 21. Hence, the usage rate and the lifespan of the keyboard can be increased. Moreover, because the waterproof unit B of the invention can be directly placed on the printed circuit board A, there is only one ventilation channel to be preserved for adjusting air pressure after the whole printed circuit board A has been conjoined. Finally, because the structure of the waterproof unit B is simple, it can be directly placed on the circuit board without any additional processing. Therefore, both timesaving and laborsaving can be achieved as well as the production cost can also be lowered.

Furthermore, except that the diameter of the pressure-adjusting hole 31 is larger than that of the first and that of the second channels 13 & 23, the pressure-adjusting hole 31 can also be provided on the first and the second channels 13 & 23 with either rectangle or circle shape. Such a circular pressure-adjusting hole 31 is shown in FIG. 5.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A waterproof structure of a printed circuit board, including:
   an upper layer membrane and a lower layer membrane, wherein conducting lines for transmitting signals are in the upper and the lower layer membranes, and the conducting lines contain line channels and contact points;
   an insulation layer, wherein a plurality of go-through holes are provided thereon corresponding to the positions of the contact points of the conducting lines; a plurality of ventilation holes located correspondingly to one another are provided on the upper layer membrane, the lower layer membrane, and the insulation layer respectively; and a waterproof unit, which is provided between the ventilation holes and the conducting lines; a first channel and a second channel are provided on the upper layer membrane and the lower layer membrane respectively and correspondingly; also, first openings and second openings are provided on the two ends of the first channel and the second channel respectively; the first openings are connected to the line channels of the conducting lines, the second openings are connected to the ventilation holes; a pressure-adjusting hole, whose periphery is larger than that of the first channel and that of the second channel, is provided on the insulation layer corresponding to positions of the first channel and the second channel;

the waterproof unit is formed by conjoining the first channel, the second channel, and the pressure-adjusting hole of the insulation layer so that the air generated by the contact points of the upper and the lower layer membranes due to receiving press-down force can be discharged to the outside, whereas the waterproof unit can prevent the external moisture from permeating into the conducting lines.

2. The waterproof structure of a printed circuit board as claimed in claim 1, wherein the first channel and the second channel all have a shape of multiple consecutive U.

3. The waterproof structure of a printed circuit board as claimed in claim 1, wherein the pressure-adjusting hole can be either a rectangle shape or a circle shape.

* * * * *